(12) United States Patent
Takahashi

(10) Patent No.: US 7,171,744 B2
(45) Date of Patent: Feb. 6, 2007

(54) SUBSTRATE FRAME

(75) Inventor: Norio Takahashi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 342 days.

(21) Appl. No.: 10/911,477

(22) Filed: Aug. 5, 2004

(65) Prior Publication Data
US 2005/0048259 A1 Mar. 3, 2005

(30) Foreign Application Priority Data
Sep. 1, 2003 (JP) .............................. 2003-308424

(51) Int. Cl.
*H05K 3/30* (2006.01)
(52) U.S. Cl. ..................... 29/832; 29/841; 438/106; 438/112; 438/113
(58) Field of Classification Search .................. 29/825, 29/832, 841; 438/106, 112, 113
See application file for complete search history.

(56) References Cited

U.S. PATENT DOCUMENTS

| | | | |
|---|---|---|---|
| 6,198,163 B1 * | 3/2001 | Crowley et al. ............ | 257/706 |
| 6,281,568 B1 * | 8/2001 | Glenn et al. ................ | 257/684 |
| 6,303,985 B1 | 10/2001 | Larson et al. | |
| 6,841,414 B1 * | 1/2005 | Hu et al. .................... | 438/106 |
| 6,847,099 B1 * | 1/2005 | Bancod et al. ............. | 257/666 |
| 7,005,326 B1 * | 2/2006 | Glenn ........................ | 438/123 |
| 7,008,825 B1 * | 3/2006 | Bancod et al. ............. | 438/123 |
| 7,030,474 B1 * | 4/2006 | Glenn ........................ | 257/666 |
| 7,067,908 B2 * | 6/2006 | Jang .......................... | 257/684 |
| 7,087,986 B1 * | 8/2006 | Bayan et al. ............... | 257/676 |
| 7,095,100 B2 * | 8/2006 | Kasuya ...................... | 257/678 |
| 7,102,208 B1 * | 9/2006 | Lee et al. ................... | 257/666 |
| 7,112,474 B1 * | 9/2006 | Glenn ........................ | 438/123 |
| 7,115,445 B2 * | 10/2006 | Lee et al. ................... | 438/123 |
| 2006/0151858 A1 * | 7/2006 | Ahn et al. .................. | 257/666 |

FOREIGN PATENT DOCUMENTS

| | | |
|---|---|---|
| JP | 07-135281 | 5/1995 |
| JP | 10-209361 | 8/1998 |
| JP | 11-087386 | 3/1999 |

* cited by examiner

*Primary Examiner*—Carl J. Arbes
(74) *Attorney, Agent, or Firm*—Takeuchi&Kubotera, LLP

(57) ABSTRACT

A substrate frame includes an insulative board (10a) having a pair of ear portions (13) extending along its longitudinal edges; a plurality of wiring substrate regions (11) arranged on the insulative board (10a) between the ear portions (13) at predetermined intervals; and a plurality of slits (15) provided between the wiring substrate regions so as to extend across the ear portions (13) or a plurality grooves (18) around the wiring substrate regions (11).

2 Claims, 3 Drawing Sheets

SUBSTRATE FRAME

BACKGROUND OF THE INVENTION

1. Field of the Invention

The present invention relates to a substrate frame for connecting to external terminals the electrodes of semiconductor chips mounted on the substrate frame and a method of making semiconductor devices using the substrate frame.

2. Description of the Related Art

Japanese patent application Kokai No. 11-87386 discloses such a semiconductor device as shown in FIGS. 2(a) and 2(b), wherein a semiconductor chip 2 is mounted on the first surface of a wiring substrate 1 with a conductive or insulative adhesive 3, with the circuit forming surface facing up. A plurality of pads or connecting electrodes 1a and their wirings (not shown) are formed on the first surface of the wiring substrate 1. The pads 1a are exposed but the wirings and the other area are covered by a solder resist. A plurality of wires 4 connect the pads 1a and the pads 2a of the semiconductor chip 2. The semiconductor chip 2, the adhesive 3, and the wires 4 are covered by a resin such as epoxy resin.

A plurality of pads and their wirings are formed on the second surface opposed to the first surface of the wiring substrate 1. Similarly to the first surface, the pads are exposed but the wirings and the other area are covered by a solder resist. A plurality of external terminals or solder balls 6 are joined to the pads on the second surface. It is understood that the wirings on the first and second surfaces are connected via through-holes.

How to make such a semiconductor device will be described.

As shown in FIG. 2(c), a substrate frame 10 is prepared by bonding a pair of copper foils on opposite surfaces of an insulating board and forming a row of wiring substrate regions 11 at predetermined intervals on each surface. On each wiring substrate, both the surfaces are etched to form wiring patterns that include pads on the first and second surfaces of a wiring substrate 1 (FIG. 2(a)) and through holes provided at predetermined locations for connecting the wiring patterns on the first and second surfaces. A nickel-gold (NiAu) electrolytic plating is applied to the interiors of the through holes for connecting the wiring patters and to the pads for increasing the bonding property with the wires 4 and the solder balls 6. A solder resist is applied to the wiring patterns and the other area but the pads.

A plurality of slits 12 are provided between the wiring substrate regions 11 and have a length less than that of the wiring substrate regions 11. A plurality of slits 14 are provided in the ear portions 13 of the substrate frame 10 and have a length less that that of the wiring substrate regions 11. These slits 12 and 14 are formed by a router process. A semiconductor chip 2 is bonded to a central mounting area 11a of the wiring substrate region 11 with a bond 3. Then, the pads 1a of the wiring substrate region 11 and the pads 2a of the semiconductor chip 2 are connected with wires 4. Then, the semiconductor chip 2, the bond 3, and the wires 4 within a package area 11b are enclosed with a resinous mass 5. A plurality of solder balls 6 are joined to the pads on the second surface of the wiring substrate region 11. Finally, the ear portions at the four corners of the wiring substrate region 11 are punched off to provide individual semiconductor devices.

However, the conventional semiconductor device suffers from the following disadvantages.

A pair of lead patters are formed between the wiring substrate region 11 and the ear portion 13 of the substrate frame 10 for electroplating the wiring pattern. The punching at the four corners of the wiring substrate region 11 can damage the cut face, lowering the reliability. The punching may be replaced by cutting the four corners with a rotary saw. The saw cutting, however, requires cutting in the vertical and lateral directions, lowering the productivity, especially, of large BGA.

SUMMARY OF THE INVENTION

Accordingly, it is an object of the invention to provide a substrate frame having the improved productivity.

According to the invention there is provided a substrate frame including an insulative board having a pair of ear portions extending along its longitudinal edges; a plurality of wiring substrate regions arranged on the insulative board between the ear portions at predetermined intervals; and a plurality of slits provided between the wiring substrate regions and extending across the ear portions or grooves around the wiring substrate regions.

The slits between the wiring substrate regions extend across the ear portions of the substrate frame so that the individual semiconductor devices can be separated by cutting the ear portions in only one direction or punching the grooves without any damage to the cut faces, thereby maximizing the productivity.

DESCRIPTION OF THE PREFERRED EMBODIMENTS

First Embodiment

Figure 1:
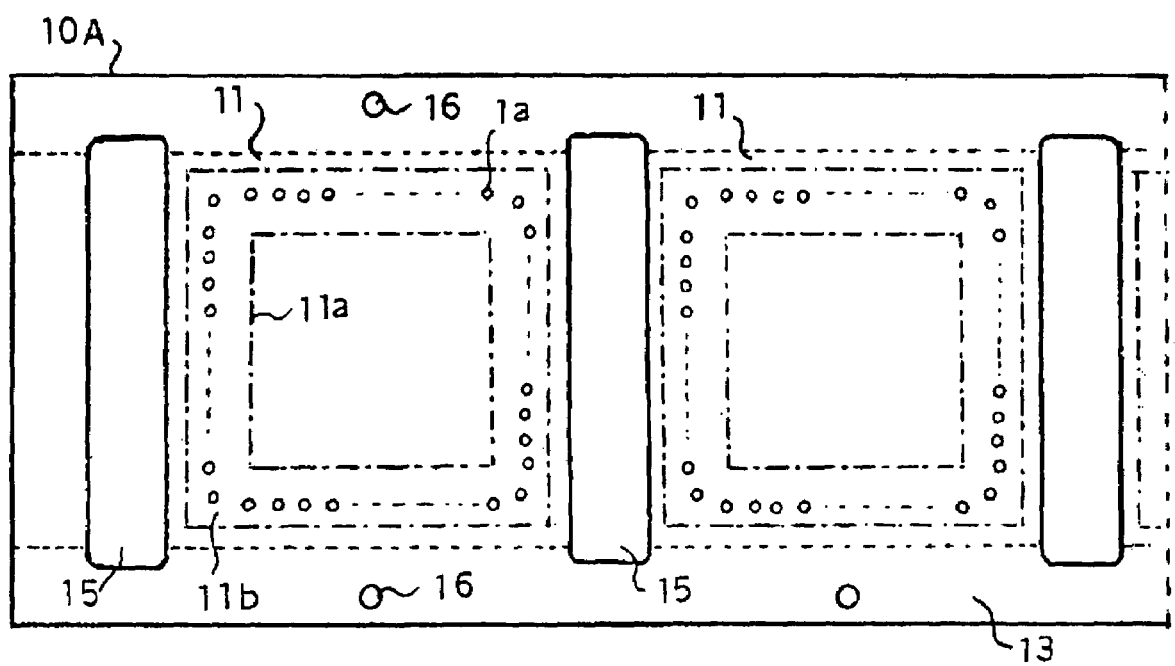
FIG. 1 is a plan view of a substrate frame according to the first embodiment of the invention.
Figure 2A:
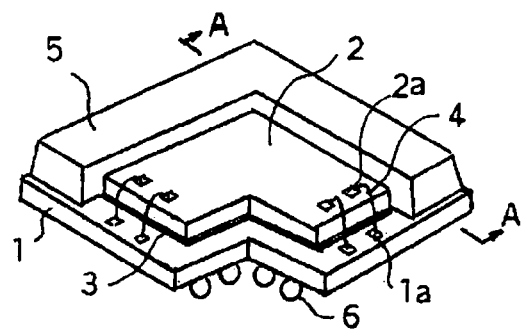
FIG. 2(a) is a perspective view of a conventional semiconductor device.
Figure 2B:
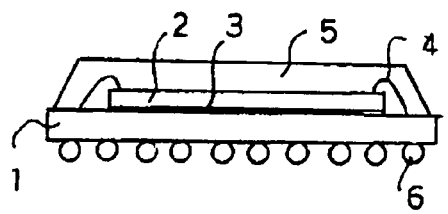
FIG. 2(b) is a sectional view taken along line A—A of FIG. 2(a)
Figure 2C:
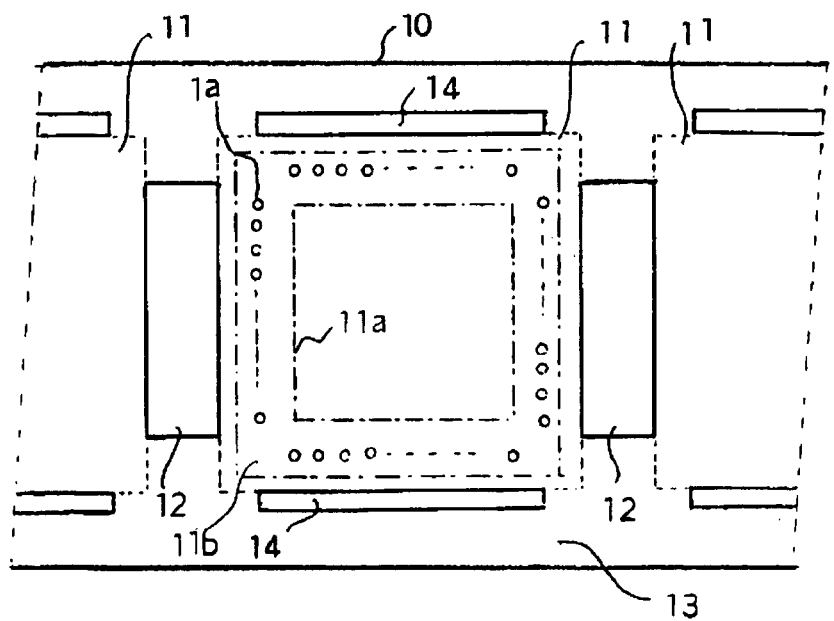
FIG. 2(c) is a plan view of a substrate frame for the semiconductor device.

In FIG. 1, a substrate frame 10A is provided to replace the substrate frame 10 in FIG. 2(c). Similarly to the substrate frame 10, this frame 10A is made by bonding a pair of copper foils to opposite surfaces of an insulative board and forming a row of wiring substrate regions 11 at predetermined intervals on each surface. The opposite surfaces of each wiring substrate region 11 are etched to form wiring patterns that include pads 1a and 1b on the first and second surfaces of the wiring substrate 1 and through-holes provided at predetermined locations for connecting the wiring patterns on the first and second surfaces. The interiors of the through-holes are plated to connect the wiring patterns but a nickel-gold electrolytic plating is applied to the pads 1a and 1b to increase the bonding property with the wires and solder balls. A solder resist is coated on the wiring patterns and the other area except for the pads 1a and 1b.

A plurality of slits 15 are provided between the wiring substrate regions 11 of the substrate frame 10A and have a length greater than that of the wiring substrate regions 11, extending across the ear portions 13 of the substrate frame 10A. Thus, the slits 15 separate the adjacent wiring substrate regions 11. These slits 15 are made by a router process.

How to make semiconductor devices with the substrate frame 10A will be described below.

A plurality of semiconductor chips 2 are bonded to the central mounting areas 11a of wiring substrate regions 11 with a bond 3 (FIG. 2(a)). Then, the pads 1a of a wiring substrate region 11 and the pads 2a of a semiconductor chip 2 are connected with bonding wires 4. Then, the semiconductor chip 2, the bond 3, and the wires 4 within a package area 11b are enclosed with a resinous mass 5. The solder balls 6 are joined to the pads 1b on the second surface of the wiring substrate region 11. Then, the ear portions 13 of the substrate frame 10A are cut off with a rotary saw to provide individual semiconductor devices.

As has been described above, the wiring substrate regions 11 of the substrate frame 10A are separated completely by the slits 15. Thus, it is possible to provide individual semiconductor devices by cutting in only one direction without damage to the cut surface.

Second Embodiment

Figure 3A:
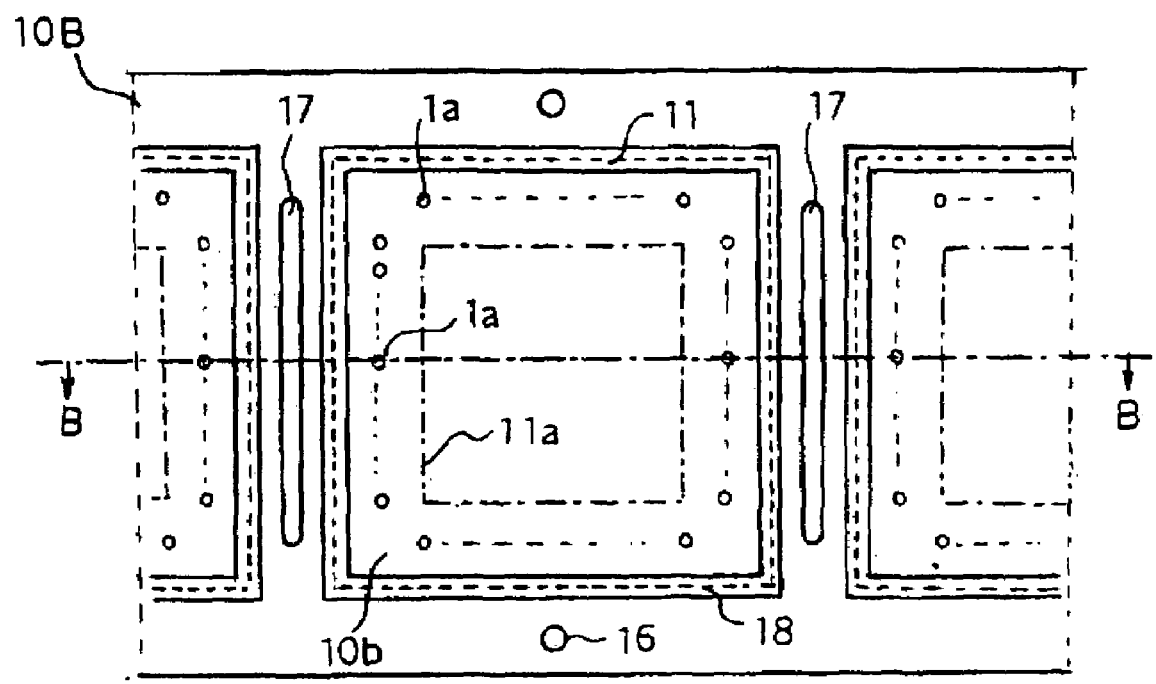
FIG. 3(a) is a plan view of a substrate frame according to the second embodiment of the invention.
Figure 3B:
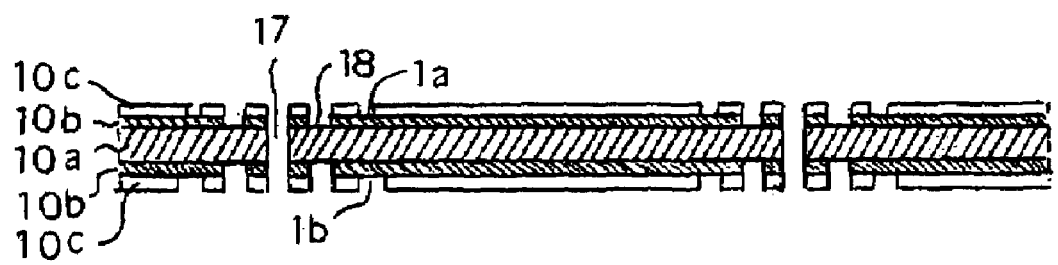
FIG. 3(b) is a sectional view taken along line B—B of FIG. 3(a).

In FIG. 3(a), a substrate frame 10B is used to replace the substrate frame 10 of FIG. 2(c). Similarly to the substrate frame 10, this substrate frame 10B is made by bonding a pair of copper foils to opposite surfaces of an insulative board 10a to form a both sided substrate and forming thereon a row of wiring substrate regions 11 at predetermined intervals. The copper foils 10b of the both sided substrate are etched to form wiring patterns that include pads 1a and 1b on the first and second surfaces of the wiring substrate 1 and through-holes at predetermined locations for connecting the wiring patterns on the first and second surfaces. The interiors of the through-holes are plated to connect the wiring patterns electrically.

Then, a solder resist 10c is coated over the wiring patterns and the other areas except for the pads 1a and 1b, to which a nickel-gold electrolytic plating is applied to increase the bonding property with the wire and the solder balls. A plurality of slits 17 are formed between the wiring substrate regions 11 by a router process to reduce the processing stress. A groove 18 is provided around each wiring substrate region 11 by removing the copper foil 10b and the solder resist 10c in a predetermined width.

How to make semiconductor devices with the substrate frame 10B will be described below.

(1) A both sided substrate is prepared by bonding a pair of copper foils 10b to opposite surfaces of an insulative board 10a. The copper foils 10c on the opposite sides are etched by the photolithographic technology to form wiring patterns that include wiring substrate regions 11 provided at predetermined intervals. The wiring patterns also include pads 1a and 1b, and lead patterns for. electrolytic plating.

(2) A plurality of through-holes are provided to connect the wiring patterns on the opposite sides of the wiring substrate 1. A plurality of holes 16 are provided in the ear portions 13 for transportation. A solder resist 10c is coated to the area other than the pads 1a and 1b and the grooves 18, and a nickel-gold electrolytic plating is applied to the pads 1a and 1b.

(3) The area other than the groove 18 is covered with an etching mask, and the wiring patter at the groove 18 (part of the lead pattern for electrolytic plating) is removed by etching.

(4) The etching mask is removed, and slits 17 are formed between the wiring substrate regions 11 by the router process to complete the substrate frame 10B.

(5) A semiconductor chip 2 is bonded with a bond 3 to a central mounting area 11a of the wiring substrate region 11, and the pads 1a of the wiring substrate region 11 and the pad 2a of the semiconductor chip 2 are connected with wires 4.

(6) The semiconductor chip 2, the bond 3, and the wires 4 within a package area 11b are enclosed with a resin 5. Solder balls 6 are joined to the pads 1b on the second surface of the wiring substrate region 11.

(7) The grooves 18 of the wiring substrate regions 11 are punched with a metal mold to provide individual semiconductor devices.

As has been described above, the substrate frame 10B has the grooves 18 from which the wiring patterns have been removed so that individual semiconductor devices are separated without any damage to the cut surfaces merely by punching the grooves 18.

The substrate frame 10A or 10B may be applied to a multi-layer substrate having three or more wiring layers. The wire bonding between the wiring substrate 1 and the semiconductor chip 2 may be replaced by the flip chip bonding.

The invention claimed is:

1. A method of making semiconductor devices, comprising the steps of:
providing an insulative board having a pair of ear portions extending along its longitudinal edges;
arranging a plurality of wiring substrate regions on said insulative board between said ear portions at predetermined intervals;
mounting semiconductor chips on said wiring substrate regions;
connecting pads of said wiring substrate regions and pads of said semiconductor chips;
enclosing said semiconductor chips with a resin; and
cutting boundaries between said wiring substrate regions and said ear portions to provide individual semiconductor devices.

2. A method of making semiconductor devices, comprising the steps of:
providing an insulative board having a pair of ear portions extending along its longitudinal edges;
a plurality of wiring substrate regions arranged on said insulative board between said ear portions at predetermined intervals;
providing a plurality of grooves around said wiring substrate regions from which patterns are removed;
mounting semiconductor chips on said wiring substrate regions;
connecting pads of said wiring substrate regions and pads of said semiconductor chips;
enclosing said semiconductor chips with a resin; and
cutting said grooves with a mold punch to provide individual semiconductor devices.

* * * * *